United States Patent
Bahr et al.

(10) Patent No.: US 10,911,055 B1
(45) Date of Patent: Feb. 2, 2021

(54) OSCILLATOR SELF-CALIBRATION

(71) Applicant: TEXAS INSTRUMENTS INCORPORATED, Dallas, TX (US)

(72) Inventors: Bichoy Bahr, Allen, TX (US); Kaichien Tsai, Allen, TX (US); Scott R. Summerfelt, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/728,070

(22) Filed: Dec. 27, 2019

(51) Int. Cl.
| | |
|---|---|
| *H03L 7/099* | (2006.01) |
| *H03L 7/24* | (2006.01) |
| *H03L 7/08* | (2006.01) |
| *H03L 7/085* | (2006.01) |
| *H03B 1/00* | (2006.01) |
| *H03L 1/02* | (2006.01) |
| *H03L 7/00* | (2006.01) |
| *H03B 28/00* | (2006.01) |
| *H01L 25/065* | (2006.01) |

(52) U.S. Cl.
CPC ........ *H03L 7/0991* (2013.01); *H01L 25/0657* (2013.01); *H03B 1/00* (2013.01); *H03B 28/00* (2013.01); *H03L 1/02* (2013.01); *H03L 1/022* (2013.01); *H03L 1/026* (2013.01); *H03L 7/00* (2013.01); *H03L 7/085* (2013.01); *H03L 7/0807* (2013.01); *H03L 7/24* (2013.01)

(58) Field of Classification Search
CPC .......... H03B 1/00; H03B 28/00; G01R 21/00; H03L 1/02; H03L 7/00; H03L 1/026; H03L 1/022; H03L 7/0991; H03L 7/24; H03L 7/0807; H01L 23/585; H01L 25/0657
USPC ........ 331/176, 154, 18, 2.44, 116 M, 108 C, 331/1 A, 2, 44; 324/76.11; 327/141
See application file for complete search history.

(56) References Cited

U.S. PATENT DOCUMENTS

| | | | |
|---|---|---|---|
| 7,968,974 B2 | 6/2011 | Summerfelt et al. | |
| 9,509,324 B2 * | 11/2016 | McDonald | ................ H03L 7/23 |
| 2012/0326700 A1 * | 12/2012 | Swanson | ............... G01P 15/097 324/76.11 |
| 2014/0232475 A1 * | 8/2014 | Elkholy | .................. H03L 1/026 331/44 |
| 2016/0133580 A1 * | 5/2016 | Bonifield | .............. H01L 23/585 257/620 |

* cited by examiner

*Primary Examiner* — Arnold M Kinkead
(74) *Attorney, Agent, or Firm* — Michael A. Davis, Jr.; Charles A. Brill; Frank D. Cimino

(57) ABSTRACT

An oscillator assembly includes a scribe seal, an oscillator circuit, and a calibration circuit. The oscillator circuit includes an output. The calibration circuit is coupled to the oscillator circuit. The calibration circuit includes a reference frequency terminal, a conductor coupled to the reference frequency terminal, and an oscillator input terminal. The conductor extends to an edge of the oscillator circuit assembly and penetrates the scribe seal. The oscillator input terminal is coupled to the output of the oscillator circuit.

7 Claims, 3 Drawing Sheets

OSCILLATOR SELF-CALIBRATION

BACKGROUND

In electronic and computing devices, at least one clock reference is generally included to provide a clock signal for synchronizing and scheduling operations. A variety of approaches exist for generating the clock signal. For example, oscillators are bunt using quartz crystal resonators, micro-electro-mechanical system (MEMS) resonators, inductor-capacitor (LC) resonators, delay circuitry, and various other components selected to provide a clock frequency suitable for a specific application.

SUMMARY

An oscillator circuit assembly and method for in-wafer calibration of the assembly are described herein. In one example, an oscillator circuit assembly includes an oscillator circuit and a calibration circuit. The oscillator circuit includes an input and an output. The calibration circuit is coupled to the oscillator circuit, and includes a reference frequency terminal and a digital phase-locked loop. The digital phase-locked loop circuit includes an output, a first input, and a second input. The output of the digital phase-locked loop circuit is coupled to the input of the oscillator circuit. The first input of the digital phase-locked loop circuit is coupled to the output of the oscillator circuit. The second input of the digital phase-locked loop circuit is coupled to the reference frequency terminal.

In another example, an oscillator circuit assembly includes a scribe seal, an oscillator circuit, and a calibration circuit. The oscillator circuit includes an output. The calibration circuit is coupled to the oscillator circuit. The calibration circuit includes a reference frequency terminal, a conductor coupled to the reference frequency terminal, and an oscillator input terminal. The conductor extends to an edge of the oscillator circuit assembly and penetrates the scribe seal. The oscillator input terminal is coupled to the output of the oscillator circuit.

In a further example, a method includes connecting a reference frequency source to a reference frequency terminal of a wafer comprising a first oscillator circuit assembly and a second oscillator circuit assembly. The reference frequency terminal is connected to a calibration circuit of the first oscillator circuit assembly via a conductor that penetrates a scribe seal of the first oscillator circuit assembly, and connected to a calibration circuit of the second oscillator circuit assembly via a conductor that penetrates a scribe seal of the second oscillator circuit assembly. The calibration circuit of the first of the first oscillator circuit assembly applies a reference frequency received via the reference frequency terminal to calibrate the first oscillator circuit assembly over temperature prior to singulation. The calibration circuit of the second oscillator circuit assembly applies the reference frequency received via the reference frequency terminal to calibrate the second oscillator circuit assembly over temperature prior to singulation.

BRIEF DESCRIPTION OF THE DRAWINGS

For a detailed description of various examples, reference will now be made to the accompanying drawings in which.

DETAILED DESCRIPTION

In this description, the term "couple" or "couples" means either an indirect or direct wired or wireless connection. Thus, if a first device couples to a second device, that connection may be through a direct connection or through an indirect connection via other devices and connections. Also, in this description, the recitation "based on" means "based at least in part on." Therefore, if X is based on Y, then X may be a function of Y and any number of other factors.

Oscillator circuit assemblies, including oscillator circuit assemblies that include micro-electro-mechanical system (MEMS) resonators; are tested and characterized over temperature to enable compensation for temperature induced frequency drift. Each oscillator circuit assembly is individually tested and calibrated after the oscillator circuit assemblies have been packaged. Individually testing and calibrating each oscillator circuit assembly is time consuming and expensive.

The calibration method described herein allows simultaneous testing and calibration of many oscillator circuit assemblies provided on a silicon wafer. For example, all of the oscillator circuit assemblies provided on a wafer may be simultaneously tested and calibrated for temperature induced frequency drift. The oscillator circuit assemblies described herein include on-die calibration circuitry. To enable calibration, a power source and a reference frequency source are connected to a wafer under test. Power and reference frequency signals are propagated to the oscillator and calibration circuits of each oscillator circuit assembly through conductors that penetrate the scribe seals of each of the oscillator circuit assemblies. The wafer is temperature cycled (e.g., heated to a maximum temperature, and cooled to a minimum temperature) while the calibration circuitry compares the reference frequency signal to an oscillator output signal. As the frequency of the oscillator output signal drifts from the frequency of the reference frequency signal, the calibration circuit determines and applies a tuning value to compensate for the drift. That is, over temperature, the calibration circuit applies a tuning value to adjust the frequency of the oscillator output signal to match the frequency of the reference frequency signal. The calibration circuit stores the tuning values and a temperature value at which each tuning value is applied in a non-volatile memory. In operation, the stored tuning values may be applied, in conjunction with stored temperature values, to compensate for temperature drift of the oscillator circuit.

Figure 1:
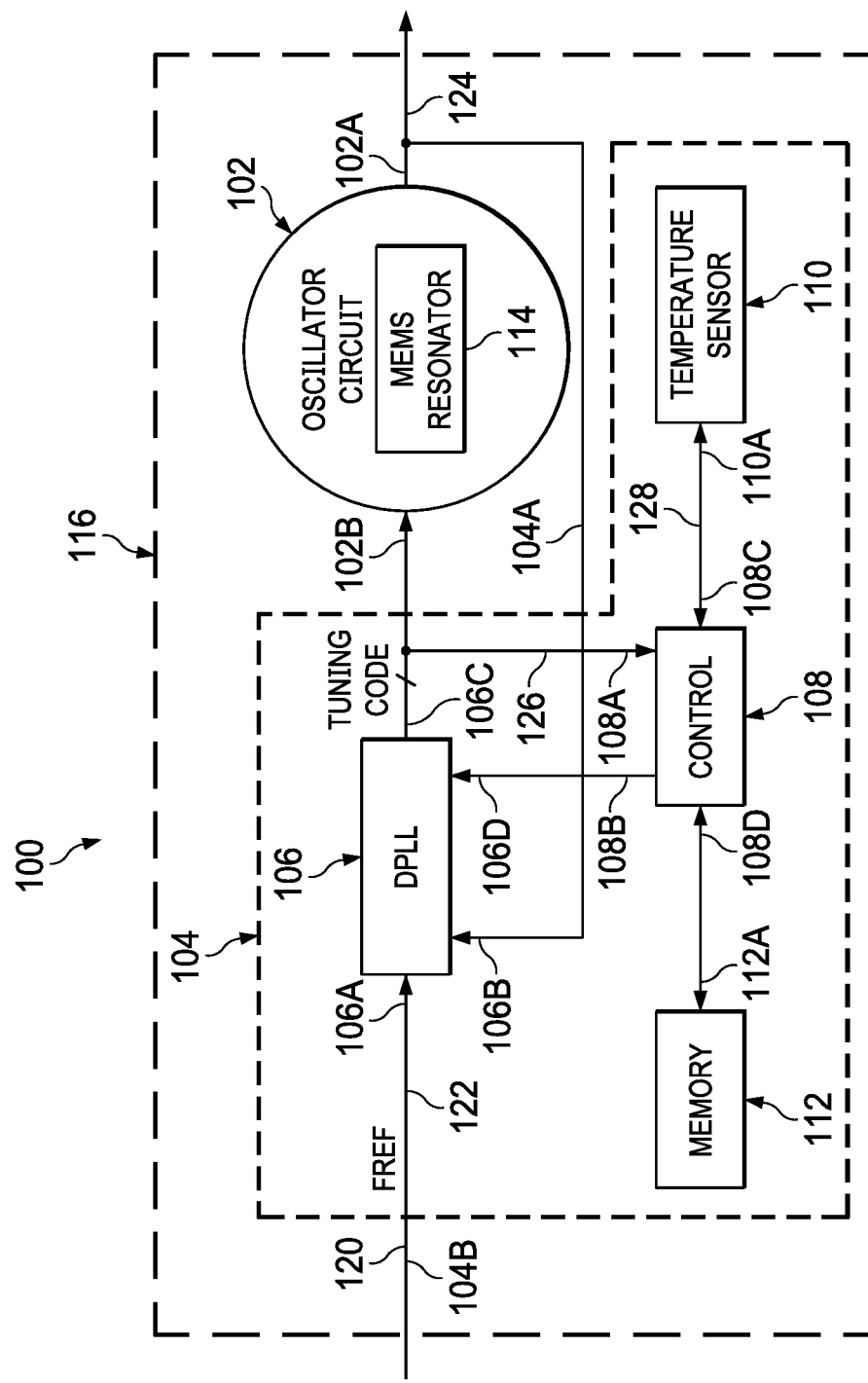
FIG. 1 shows block diagram of an example oscillator circuit assembly that includes built-in self-calibration circuitry in accordance with this description.

FIG. 1 shows block diagram of an example oscillator circuit assembly 100 that includes built-in self-calibration circuitry in accordance with this description. The oscillator circuit assembly 100 includes an oscillator circuit 102 and a calibration circuit 104. The oscillator circuit 102 includes a MEMS resonator 114, a crystal resonator, or other timing circuitry in various implementations. The oscillator circuit 102 generates an oscillator output signal 124. The calibration circuit 104 is coupled to the oscillator circuit 102.

The calibration circuit 104 includes a digital phase-locked loop circuit 106, a control circuit 108, a temperature sensor 110, a memory 112, an oscillator input terminal 104A, and a reference frequency terminal 104B. A conductor 120 extends from the reference frequency terminal 104B through the scribe seal 116 to an edge of the die on which the oscillator circuit assembly 100 is constructed. An input 106A of the digital phase-locked loop circuit 106 is coupled to the reference frequency terminal 104B. An input 106B of the digital phase-locked loop circuit 106 is coupled to an output 102A of the oscillator circuit 102 via the oscillator input terminal 104A. An output 106C of the digital phase-locked loop circuit 106 is coupled to an input 102B of the oscillator circuit 102. The digital phase-locked loop circuit 106 compares the reference signal 122 received via the input 106A to the oscillator output signal 124 received via the input 106B, and generates a tuning value 126 to adjust the frequency of the oscillator output signal 124. The digital phase-locked loop circuit 106 provides the tuning value 126 to the oscillator circuit 102, and the oscillator circuit 102 applies the tuning value 126 to adjust the frequency of the oscillator output signal 124 to match the frequency of the reference signal 122 received at the input 106A. For example, the tuning value 126 may adjust a value of capacitance in the oscillator circuit 102 to adjust the frequency of the oscillator output signal 124.

The temperature sensor 110 measures the temperature of the oscillator circuit assembly 100, and provides temperature measurements 128 to the control circuit 108. The control circuit 108 is coupled to the digital phase-locked loop circuit 106, the temperature sensor 110, and the memory 112. The control circuit 108 includes an input 108A coupled to the output 106C of the digital phase-locked loop circuit 106 for reception of the tuning value 126 generated by the digital phase-locked loop circuit 106. The control circuit 108 includes an input 108C for reception of the temperature measurements 128 provided by the temperature sensor 110. The control circuit 108 writes the tuning value 126 and the temperature measurements 128 into the memory 112. The control circuit 108 includes an output 108D coupled to an input 112A of the memory 112. In some implementations, the control circuit 108 writes the tuning value 126 into locations of the memory 112 that correspond to a value of the temperature measurements 128. In some implementations, the control circuit 108 is triggered to write the tuning value 126 into the memory 112 by a change in the temperature measurements 128 or a change in the tuning value 126. Thus, the control circuit 108 may detect a change in the tuning value 126 or a change in the temperature measurements 128, and responsive to the change, write the tuning value 126, and the temperature measurements 128 in some implementations, into the memory 112. The memory 112 may be an electrically erasable programmable read only memory, a FLASH memory, a ferroelectric memory, or other non-volatile memory.

The control circuit 108 may also include an output 108B coupled to an input 106D of the digital phase-locked loop circuit 106. The control circuit 108 may provide control information to the digital phase-locked loop circuit 106 via the output 108B. In some implementations, a control signal may be provided via a conductor that penetrates the scribe seal 116, where the control signal indicates to the control circuit 108 whether calibration is being performed. Some implementations may determine whether calibration is being performed based on the presence of the reference signal 122. For example, the control circuit 108 may be coupled to the reference frequency terminal 104B for receipt of the reference signal 122 and include circuitry to detect the presence of the reference signal 122. The control circuit 108 may enable the digital phase-locked loop circuit 106 when the reference signal 122 is present, and disable the digital phase-locked loop circuit 106 when the reference signal 122 is not present. The control circuit 108 may enable or disable calibration of the oscillator circuit assembly 100 based on the presence of the reference signal 122. The control circuit 108 may include a hardware state machine or a microcontroller configured to control storage of the tuning values 126 in the memory 112, and provide other functionality of calibration of the oscillator circuit assembly 100 as described herein.

When the oscillator circuit assembly 100 is operating normally (i.e., not calibrating), then the control circuit 108 may read the tuning values 126 from the memory 112 based on the temperature measurements 128 provided by the temperature sensor 110, and provide the tuning values 126 read from the memory 112 to the oscillator circuit 102 to adjust the frequency of the oscillator output signal 124.

Figure 2:
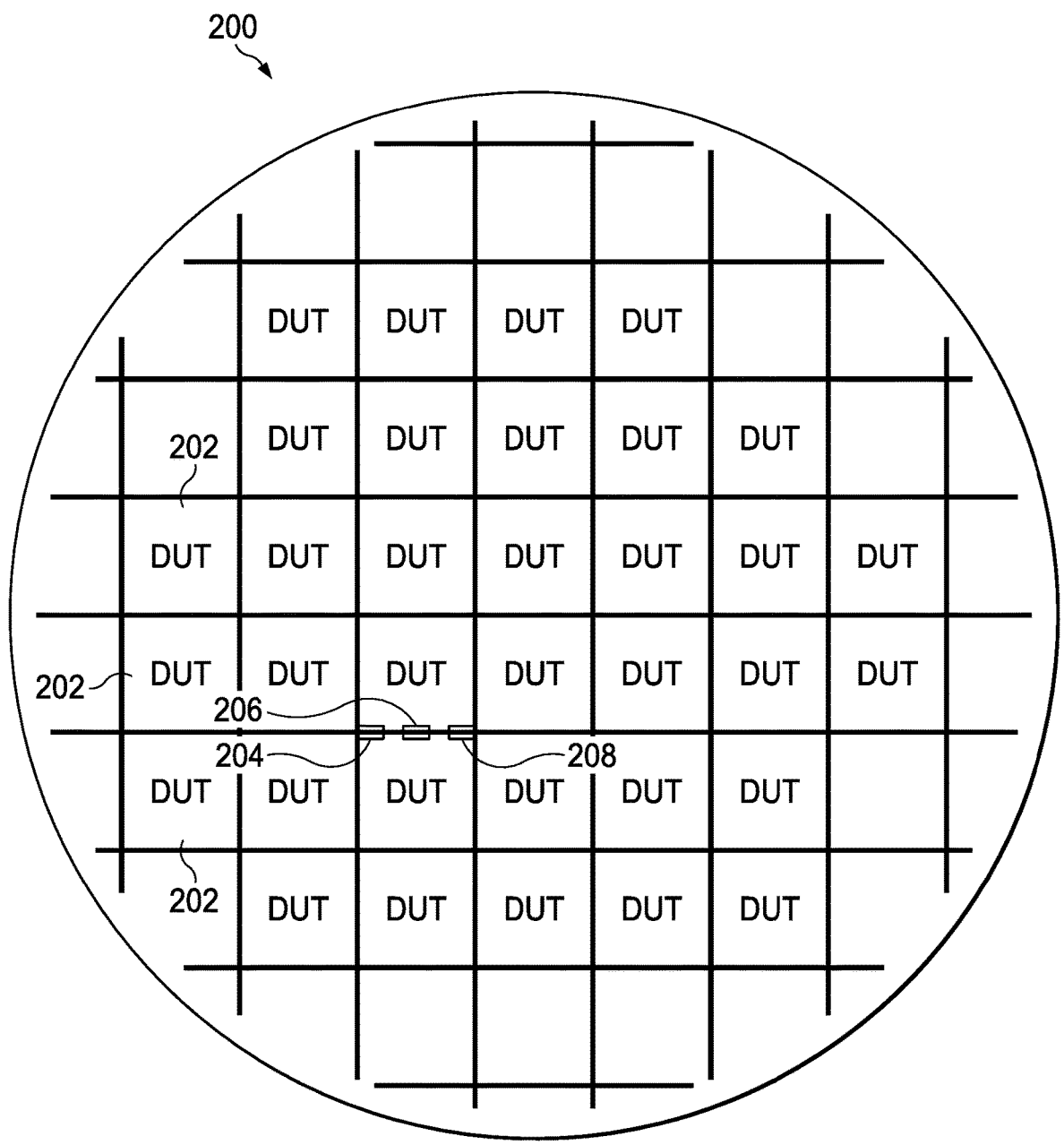
FIG. 2 shows an example wafer that includes multiple oscillator circuit assemblies configured for simultaneous self-calibration in accordance with this description.

FIG. 2 shows an example wafer 200 that includes multiple oscillator circuit assemblies 202 configured for simultaneous self-calibration in accordance with this description. Each oscillator circuit assembly 202 is an implementation of the oscillator circuit assembly 100. The wafer 200 may include any number of the oscillator circuit assemblies 202. The wafer 200 includes power terminals 204 and 206, and a reference signal terminal 208. Any number of the oscillator circuit assemblies 202 may be coupled to the power terminal 204, the power terminal 206, and the reference signal terminal 208. For example, all of the oscillator circuit assemblies 202 provided on the wafer 200 may be coupled to the power terminal 204, the power terminal 206, and the reference signal terminal 208. When the oscillator circuit assemblies 202 are to be calibrated, the power terminal 204 and the power terminal 206 are connected to a power source, and the reference signal terminal 208 is connected to a reference signal source, such as a rubidium oscillator or other accurate low-drift clock source.

The oscillator circuit assemblies 202 detect the reference signal and enter calibration mode. The wafer 200 is disposed in temperature chamber and temperature cycled across the predetermined range of calibration temperatures. As the temperature of the wafer 200 changes, in each of the oscillator circuit assemblies 202 the digital phase-locked loop circuit 106 generates tuning values 126 to adjust the oscillator output signal 124, and the control circuit 108 stores the tuning values 126 in the memory 112. Because the digital phase-locked loop circuit 106 is very fast, the 102 remains locked to the reference signal source as the temperature of the wafer 200 changes. This advantageously allows for temperature change and calibration at a relatively fast rate. In contrast, for each temperature at which calibration is performed, other calibration techniques require that before calibration is performed the temperature of an integrated circuit be allowed stabilize, which may take several minutes. Thus, each of the oscillator circuit assemblies 202 simultaneously self-calibrates, without allowing soak time for temperature stabilization, which reduces the time and cost associated with calibrating the oscillator circuit assemblies 202 relative to post-singulation calibration.

Figure 3:
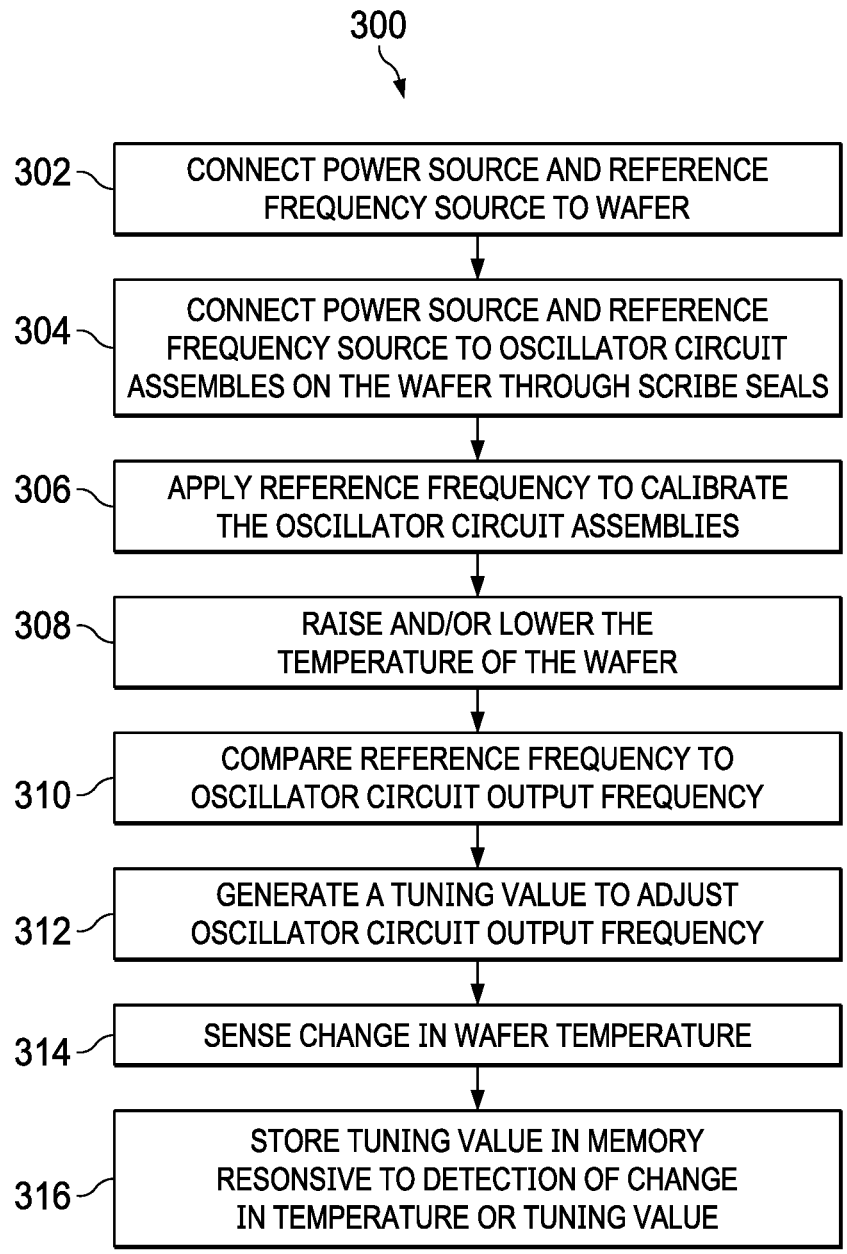
FIG. 3 shows a flow diagram for an example method for simultaneous self-calibration of oscillator circuit assemblies on a wafer in accordance with this description.

FIG. 3 shows a flow diagram for a method 300 for simultaneous self-calibration of oscillator circuit assemblies on a wafer in accordance with this description. Though depicted sequentially as a matter of convenience, at least some of the actions shown can be performed in a different order and/or performed in parallel. Additionally, some implementations may perform only some of the actions shown. At least some operations of the method 300 may be performed by an implementation of the oscillator circuit assembly 100.

In block 302, multiple oscillator circuit assemblies 202 formed on the wafer 200 are to be simultaneous calibrated. For each oscillator circuit assembly 202, the circuitry of the oscillator circuit 102 and the calibration circuit 104 have been formed on the 200, and the 114 has been coupled to the oscillator circuit 102. A power source is connected to the power terminal 204 and the power terminal 206, and a reference frequency source is connected to the reference signal terminal 208. For example, a reference voltage, such as ground is connected to the power terminal 204, an operating voltage, such as 1.8 volts, is connected to the power terminal 206, and a rubidium oscillator is connected to the reference signal terminal 208.

In block 304, the power source and the reference frequency source are connected to each of the oscillator circuit assemblies 202 to be calibrated. That is, conductors carrying the power signals and the reference frequency signal received at the power terminal 204, the power terminal 206, and the reference signal terminal 208 pass through the scribe seal of each of the oscillator circuit assemblies 202 to connect the power signals and the reference frequency source to each of the oscillator circuit assemblies 202.

In block 306, each of the oscillator circuit assemblies 202 detects the reference signal 122, enables calibration, and begins to apply the reference frequency to calibrate for frequency drift.

In block 308, the wafer 200 is disposed in a temperature chamber, and the temperature of the wafer 200 is increased to a predetermined upper limit, and/or the temperature of the wafer 200 is decreased to a predetermined lower limit to allow the oscillator circuit assemblies 202 to test and adjust the oscillator frequency over the range of applied temperatures.

In block 310, the digital phase-locked loop circuit 106 of each oscillator circuit assembly 202 compares the reference frequency to the frequency of the oscillator signal generated by the oscillator circuit 102 of the oscillator circuit assembly 202.

In block 312, the digital phase-locked loop circuit 106 of each oscillator circuit assembly 202 generates a tuning value 126 to adjust the frequency of the oscillator output signal 124, so that the frequency of the oscillator output signal 124 matches the reference frequency.

In block 314, each of the oscillator circuit assemblies 202 senses a change in the temperature of the wafer 200. That is, the temperature sensor 110 of each oscillator circuit assembly 202 senses a change in the temperature of the oscillator circuit assemblies 202, and the temperature sensor 110 provides a temperature measurement 128 to the control circuit 108 indicating that the temperature of the oscillator circuit assembly 202 has changed.

In block 316, each of the oscillator circuit assemblies 202 stores the tuning values 126 applied to adjust the frequency of the oscillator output signal 124 in the memory 112 with associated temperature information (e.g., the temperature measurements 128). For example, the control circuit 108 may store the tuning value 126 responsive to detection of a change in the temperature measurements 128 or responsive to detection of a change in the tuning value 126.

Modifications are possible in the described embodiments, and other embodiments are possible, within the scope of the claims.

What is claimed is:

1. A method, comprising:
   connecting a reference frequency source to a reference frequency terminal of a wafer comprising a first oscillator circuit assembly and a second oscillator circuit assembly;
   connecting the reference frequency terminal to a calibration circuit of the first oscillator circuit assembly via a first conductor that penetrates a scribe seal of the first oscillator circuit assembly;
   connecting the reference frequency terminal to a calibration circuit of the second oscillator circuit assembly via a second conductor that penetrates a scribe seal of the second oscillator circuit assembly;
   applying, by the calibration circuit of the first oscillator circuit assembly, a reference signal received via the reference frequency terminal to calibrate the first oscillator circuit assembly over temperature prior to singulation; and
   applying, by the calibration circuit of the second oscillator circuit assembly, the reference signal received via the reference frequency terminal to calibrate the second oscillator circuit assembly over temperature prior to singulation.

2. The method of claim 1, further comprising:
   comparing, by the calibration circuit of the first oscillator circuit assembly, the reference signal generated by the reference frequency source and an oscillator signal generated by the first oscillator circuit assembly; and
   comparing, by the calibration circuit of the second oscillator circuit assembly, the reference signal generated by the reference frequency source and an oscillator signal generated by the second oscillator circuit assembly.

3. The method of claim 1, further comprising:
   generating, by the calibration circuit of the first oscillator circuit assembly, a first tuning value to adjust a frequency of the oscillator signal generated by the first oscillator circuit assembly to match a frequency of the reference signal; and
   generating, by the calibration circuit of the second oscillator circuit assembly, a second tuning value to adjust a frequency of the oscillator signal generated by the second oscillator circuit assembly to match a frequency of the reference signal.

4. The method of claim 3, further comprising:
   storing the first tuning value in a memory of the first oscillator circuit assembly; and
   storing the second tuning value in a memory of the second oscillator circuit assembly.

5. The method of claim 4, further comprising:
   sensing a change in a temperature of the wafer by the calibration circuit of the first oscillator circuit assembly; and
   sensing the change in the temperature of the wafer by the calibration circuit of the second oscillator circuit assembly.

6. The method of claim 5, further comprising:
   storing the first tuning value responsive to detection of a change in the first tuning value or detection of a change in sensed temperature of the wafer; and
   storing the second tuning value responsive to detection of a change in the second tuning value or detection a change in sensed temperature of the wafer.

7. The method of claim 1, further comprising raising and lowering a temperature of the wafer to calibrate the first oscillator circuit assembly and the second oscillator circuit assembly.

* * * * *